United States Patent
Zeidler et al.

(10) Patent No.: US 9,384,938 B2
(45) Date of Patent: Jul. 5, 2016

(54) PARTICLE-OPTICAL SYSTEMS AND ARRANGEMENTS AND PARTICLE-OPTICAL COMPONENTS FOR SUCH SYSTEMS AND ARRANGEMENTS

(75) Inventors: Dirk Zeidler, Oberkochen (DE); Thomas Kemen, Aalen (DE); Pascal Anger, Aalen (DE); Antonio Casares, Aalen (DE); Christof Riedesel, Essingen (DE)

(73) Assignees: CARL ZEISS MICROSCOPY GMBH, Oberkochen (DE); APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 13/825,820
(22) PCT Filed: Sep. 23, 2011
(86) PCT No.: PCT/EP2011/004777
§ 371 (c)(1), (2), (4) Date: Mar. 24, 2013
(87) PCT Pub. No.: WO2012/041464
PCT Pub. Date: Apr. 5, 2012

(65) Prior Publication Data
US 2013/0187046 A1 Jul. 25, 2013

Related U.S. Application Data

(60) Provisional application No. 61/404,126, filed on Sep. 28, 2010.

(51) Int. Cl.
*H01J 37/09* (2006.01)
*B82Y 10/00* (2011.01)
(Continued)

(52) U.S. Cl.
CPC ............. *H01J 37/09* (2013.01); *B82Y 10/00* (2013.01); *B82Y 40/00* (2013.01); *H01J 37/28* (2013.01);
(Continued)

(58) Field of Classification Search
CPC ............. H01J 2237/2817; H01J 37/28; H01J 37/3177; H01J 37/09; H01J 2237/0453; H01J 2237/0458; H01J 2237/1205; G01N 23/225; B82Y 40/00; B82Y 10/00

USPC .......... 250/310, 307, 306, 311, 492.2, 492.1, 250/492.3, 440.11
See application file for complete search history.

(56) References Cited

U.S. PATENT DOCUMENTS 4,164,658 A * 8/1979 Frosien ............... H01J 37/3045
250/397
(Continued)

FOREIGN PATENT DOCUMENTS

JP 2001237161 A 8/2001
(Continued)

OTHER PUBLICATIONS

Taiwanese Office Action dated Jun. 11, 2015 issued in corresponding Taiwanese Patent Application No. 100134824.

*Primary Examiner* — Wyatt Stoffa
(74) *Attorney, Agent, or Firm* — Morris & Kamlay LLP (57) ABSTRACT

The present invention concerns a charged-particle multi-beamlet system that comprises a source of charged particles (301); a first multi-aperture plate (320) having plural apertures disposed in a charged particle beam path of the system downstream of the source; a first multi-aperture selector plate (313) having plural apertures; a carrier (340), wherein the first multi-aperture selector plate is mounted on the carrier; and an actuator (350) configured to move the carrier such that the first multi-aperture selector plate is disposed in the charged particle beam path of the system downstream of the source in a first mode of operation of the system, and such that the first multi-aperture selector plate is disposed outside of the charged particle beam path in a second mode of operation of the system. The source, the first multi-aperture plate and the carrier of the system are arranged such that a first number of charged particle beamlets is generated at a position downstream of both the first multi-aperture plate and the first multi-aperture selector plate in the first mode of operation, and that a second number of charged particle beamlets is generated at the position in the second mode of operation, wherein the first number of beamlets differs from the second number of beamlets.

18 Claims, 5 Drawing Sheets

(51) Int. Cl.
  *B82Y 40/00* (2011.01)
  *H01J 37/28* (2006.01)
  *H01J 37/317* (2006.01)

(52) U.S. Cl.
  CPC ..... *H01J 37/3177* (2013.01); *H01J 2237/0453* (2013.01); *H01J 2237/0458* (2013.01); *H01J 2237/1205* (2013.01)

(56) References Cited

U.S. PATENT DOCUMENTS

| | | | | |
|---|---|---|---|---|
| 4,354,111 | A * | 10/1982 | Williams | B82Y 10/00 250/396 R |
| 5,892,224 | A * | 4/1999 | Nakasuji | 250/310 |
| 6,252,412 | B1 | 6/2001 | Talbot et al. | |
| 7,232,997 | B2 | 6/2007 | Edinger et al. | |
| 8,039,813 | B2 * | 10/2011 | Casares et al. | 250/396 R |
| 2001/0016299 | A1 | 8/2001 | Yamamoto et al. | |
| 2002/0028399 | A1 | 3/2002 | Nakasuji et al. | |
| 2002/0033449 | A1 | 3/2002 | Nakasuji et al. | |
| 2002/0109090 | A1 | 8/2002 | Nakasuji et al. | |
| 2002/0130262 | A1 | 9/2002 | Nakasuji et al. | |
| 2002/0142496 | A1 | 10/2002 | Nakasuji et al. | |
| 2002/0148961 | A1 | 10/2002 | Nakasuji et al. | |
| 2003/0127593 | A1 | 7/2003 | Shinada et al. | |
| 2003/0153459 | A1 | 8/2003 | Kato et al. | |
| 2004/0135515 | A1 | 7/2004 | Hamashima et al. | |
| 2005/0092921 | A1 | 5/2005 | Nakasuji et al. | |
| 2005/0230621 | A1 * | 10/2005 | Edinger | G01N 23/2273 250/311 |
| 2008/0054184 | A1 * | 3/2008 | Knippelmeyer | B82Y 10/00 250/396 ML |
| 2009/0114818 | A1 * | 5/2009 | Casares et al. | 250/307 |
| 2009/0212229 | A1 | 8/2009 | Wieland et al. | |
| 2010/0133433 | A1 * | 6/2010 | Tanimoto | H01J 37/244 250/310 |
| 2012/0061583 | A1 | 3/2012 | Wieland et al. | |
| 2012/0104252 | A1 * | 5/2012 | Knippelmeyer et al. | 250/307 |

FOREIGN PATENT DOCUMENTS

| | | |
|---|---|---|
| TW | 200703409 A | 1/2007 |
| TW | 200952022 A | 12/2009 |
| WO | 02091421 A1 | 11/2002 |
| WO | 2005/024881 A2 | 3/2005 |
| WO | 2007/028596 A1 | 3/2007 |
| WO | 2007/060017 A2 | 5/2007 |

* cited by examiner

PARTICLE-OPTICAL SYSTEMS AND ARRANGEMENTS AND PARTICLE-OPTICAL COMPONENTS FOR SUCH SYSTEMS AND ARRANGEMENTS

FIELD OF THE INVENTION

The present invention relates to charged-particle systems generating and using multiple beamlets of charged particles. The present invention relates in particular to charged-particle inspection systems such as for example microscopy systems and to charged-particle modification systems such as for example electron lithography or selective material deposition/removal systems.

The invention may be applied to charged particles of any type, such as electrons, ions (charged atoms or molecules), positrons, muons, and others.

BACKGROUND OF THE INVENTION

The increasing demand for ever smaller and more complex microstructured devices and the continuing demand for an increase of a throughput in the manufacturing and inspection processes thereof have been an incentive for the development of particle-optical systems that use multiple charged particle beamlets in place of a single charged particle beam, thus significantly improving the throughput of such systems. The multiple charged particle beamlets may be provided by a single column using a multi-aperture array, for instance, or by multiple individual columns, or a combination of both, as will be described in more detail below. The use of multiple beamlets is associated with a whole range of new challenges to the design of particle-optical components, arrangements and systems, such as microscopes, lithography systems, and mask repair systems.

A conventional multiple charged-particle multi-beamlet system is known from U.S. Pat. No. 6,252,412 BI. The electron microscopy apparatus disclosed therein is used for inspecting an object, such as a semiconductor wafer. A plurality of primary electron beams is focused in parallel to each other on the object to form a plurality of primary electron spots thereon. Secondary electrons generated by the primary electrons and emanating from respective primary electron spots are detected. For each primary electron beam a separate electron beam column is provided. The plurality of separate electron beam columns is closely packed. A density of the primary electron beam spots formed on the object is limited by a remaining footprint of the electron beam columns forming the electron microscopy apparatus. Thus, the number of primary electron beam spots, which may be formed simultaneously on the object, is also limited in practice, resulting in a limited throughput of the apparatus when inspecting semiconductor wafers at a high resolution.

From U.S. Pat. No. 5,892,224, US 2002/0148961 AI, US 2002/0142496 AI, US 2002/0130262 AI, US 2002/0109090 AI, US 2002/0033449 AI, US 2002/0028399 AI, electron microscopy apparatuses are known which use a plurality of primary electron beamlets focused onto the surface of the object to be inspected.

From WO 2005/024881, a particle-optical system is known, wherein a plurality of beamlets are generated by illuminating a multi-aperture plate having a plurality of apertures formed therein with a single electron beam generated by an electron source provided upstream of the multi-aperture plate. The electron beamlets are formed downstream of the multi-aperture plate by those electrons of the electron beam that traverse the apertures. The plurality of primary electron beamlets is focused on the object by an objective lens having a bore, which is traversed by all primary electron beamlets. An array of primary electron spots is then formed on the object. Secondary electrons emanating from each primary electron spot form a respective secondary electron beamlet, such that a plurality of secondary electron beamlets corresponding to the plurality of primary electron beam spots is generated. The plurality of secondary electron beamlets also traverse the objective lens, and the apparatus provides a secondary electron beam path such that each of the secondary electron beamlets is supplied to a respective one of a plurality of detectors. A Wien-filter is used for separating the secondary electron beam path from a beam path of the primary electron beamlets. Since one common primary electron beam path comprising the plurality of primary electron beamlets and one common secondary electron beam path comprising the plurality of secondary electron beamlets is used, irradiation and imaging of an object can be performed simultaneously in a plurality of sub-regions within the field of view thus enhancing the throughput of the system by reducing the inspection or processing time.

Increasing the number of primary beamlets used can thus increase the throughput of such a system. The maximum possible number of beamlets within a utilizable field of view is defined by the minimum beamlet pitch achievable, which in turn is directly related to the resolution of the secondary electron optical system. The latter is primarily a function of the electric field strength present within the space between the sample surface and the objective lens of the particle-optical system, which functions as an extraction field for the secondary electrons. An increase in the strength of the extraction field generally improves the lateral (transverse to the system's optical axis) resolution of the secondary electron-optical system.

The electrical field strength above the sample surface can however not be adjusted at will, since many samples tolerate only limited electrical field strengths at their surface. Electrical fields of higher strength can result in an unwanted modification of the sample's surface configuration to the point of damaging the sample. Since the extraction field strength at the sample surface is to a certain amount determined by the field penetration from components of the system's charged-particle optical column, a changing of the extraction field over a wide range would require an adaptation of the column's mechanical setup and of the potentials applied to its electro-optically operative components. Since the potentials within the particle-optical column are usually predetermined, respective changes of the charged-particle optical column are not possible. Accordingly, the part of the extraction field strength defined by the penetration from components of the system's charged-particle optical column forms a restricted parameter, so that the extraction field strength can generally be changed only within a limited range.

The maximum possible number of primary beamlets and thus the throughput of the system can therefore not be optimized to applications of the charged-particle optical system, where samples are used, which allow higher extraction field strengths.

It is therefore desirable to have features available in charged-particle optical systems enabling an effective and easy to manage adaptation of the system to a particular application.

SUMMARY OF THE INVENTION

The present invention has been accomplished taking the above technical problems into consideration.

Embodiments of the present invention provide a charged-particle multi-beamlet system for forming a plurality of charged-particle beamlets, the number of which can easily be adapted to a particular application of the system.

The charged-particle multi-beamlet system comprises a source of charged particles; a first multi-aperture plate having plural apertures disposed in a charged particle beam path of the system downstream of the source; a first multi-aperture selector plate having plural apertures; a carrier, wherein the first multi-aperture selector plate is mounted on the carrier; and an actuator configured to move the carrier such that the first multi-aperture selector plate is disposed in the charged particle beam path of the system downstream of the source in a first mode of operation of the system, and such that the first multi-aperture selector plate is disposed outside of the charged particle beam path in a second mode of operation of the system. The source, the first multi-aperture plate and the carrier of the charged-particle multi-beamlet system are hereby arranged such that a first number of charged particle beamlets is generated at a position downstream of both the first multi-aperture plate and the first multi-aperture selector plate in the first mode of operation, and that a second number of charged particle beamlets is generated at the position in the second mode of operation, wherein the first number of beamlets differs from the second number of beamlets.

The charged-particle multi-beamlet system may further comprise a focusing lens disposed in a beam path downstream of both the first multi-aperture plate and the first multi-aperture selector plate. Such focusing lens enables a focusing of the beamlets onto the surface of an object disposed downstream of the focusing lens for forming a plurality of primary charged-particle beam spots thereon. For a positioning of objects, the system comprises preferably a stage for mounting an object in an object plane disposed downstream of the focusing lens.

The charged-particle multi-beamlet system may furthermore comprise a first voltage supply configured to supply a first voltage to the first multi-aperture plate such that charged particle beamlets traversing the apertures of the first multi-aperture plate each have a beamlet focus at a distance downstream of the first multi-aperture plate. By setting a respective potential to the first multi-aperture plate, the first multi-aperture plate represents an array of individual electrostatic lenses, which will in the following also be referred to as micro lens array.

The focusing lens of the charged-particle multi-beamlet system is hereby preferably configured such that the beamlet foci are imaged onto the object plane. The size of the primary charged-particle beam spots on an object or sample surface positioned in the object plane of the focusing lens is hereby minimized.

The charged-particle multi-beamlet system may further comprise a field-separating electrode having an aperture disposed in the charged particle beam path downstream of the focusing lens and upstream of the object plane. A respective field-separating electrode affects the field strength at the surface of the object located in or close to the object plane and reduces thus the risk of modifying the surface configuration of a device under test or sample, respectively. In a further embodiment hereof, the aperture of the field-separating electrode has a diameter such that it is traversed by the first number of beamlets in the first mode of operation and by the second number of beamlets in the second mode of operation. By having the aperture of field-separating electrode being adapted to the different beamlet configurations in the different modes of operation, a switching between the different modes of operation is facilitated. In preferred embodiments, the diameter of the field-separating electrode is smaller than at least one of 2.0 mm, 1.5 mm, 1.0 mm, 0.8 mm, 0.6 mm and 0.4 mm, allowing to adapt the aperture diameter to field of view of the charged-particle multi-beamlet system.

According to a further embodiment of the charged-particle multi-beamlet system, the focusing lens has a bore diameter that is traversed by the plurality of beamlets, and wherein at least one of the following relations is fulfilled:

$Db/De>2$, $Db/De>5$, $Db/De>10$ and $Db/De>20$, with Db indicating the bore diameter of the focusing lens, and De a diameter of the field-separating electrode.

According to a further preferred embodiment, a distance of the field-separating electrode from the object plane is smaller than 2.0 mm, 1.2 mm, 0.8 mm, 0.5 mm, 0.3 mm and 0.2 mm.

A further embodiment comprises a second voltage supply configured to supply a second voltage to the field-separating electrode and a third voltage supply configured to supply a third voltage to the object. This allows controlling the electric field strength at the object surface. In embodiments hereof, the voltage potential applied to the field-separating electrode matches the voltage potential applied to a lower face of the focusing lens facing the field-separating electrode, whereby the second voltage supply may according to a particular embodiment be used both for supplying the field-separating electrode and the lower face of the focusing lens. In a further embodiment hereof, the charged-particle optical system further comprises a controller configured to control the actuator and the second and third voltage supplies, whereby the controller controls the actuator such that the first number of beamlets in the first mode of operation is smaller than the second number of beamlets in the second mode of operation. It is noted that the controller may be implemented in single-unit as well as in multi-unit form.

The controller is in a further embodiment hereof configured to control the first and second voltage supplies such that a first voltage difference exists between the second voltage and the third voltage in the first mode of operation, and such that a second voltage difference exists between the second voltage and the third voltage in the second mode of operation, and wherein the first voltage difference is different from the second voltage difference. By controlling the voltage difference between the second and third voltage to the mode of operation, the electric field at the object surface can be adapted to the configuration of the primary charged-particle beam spots on the object surface. In a particular embodiment hereof, the first voltage difference is smaller than the second voltage difference, reflecting the difference in the number of primary charged-particle beam spots between the operation modes.

According to a further embodiment of the charged-particle optical system, the controller is configured to control the second and third voltage supplies such that a first electrical field strength exists at the object plane in the first mode of operation, and such that a second electrical field strength exists at the object plane in the second mode of operation, and wherein the first electrical field strength is different from the second electrical field strength. According to a further embodiment hereof, the first electrical field strength is smaller than the second electrical field strength.

In a preferred embodiment of the charged-particle multi-beamlet system, the apertures of the first multi-aperture plate are arranged in a regular pattern, which allows a uniform division of the irradiated object surface into sub-regions, each irradiated by one of the beamlets. The regular pattern hereby includes preferably at least one of a hexagonal pattern and a rectangular pattern, the first enabling the highest possible density of beamlets, the second a straightforward subdividing of the area of interest into a rectangular pattern of sub-regions.

According to a further embodiment, the focusing lens comprises magnetic pole pieces and at least one coil for generating a focusing magnetic field between the pole pieces. The controller is hereby favorably configured to control the focusing magnetic field such that the focusing magnetic field is substantially a same field in both the first and second modes of operation.

According to an advantageous development, an embodiment of the charged-particle optical system comprises a focusing lens having at least one pair of electrodes and a voltage supply to generate a focusing electric field between the pair of electrodes. Hereby, the controller is advantageously configured to control the focusing electric field such that the focusing electric field is a same field in both the first and second modes of operation.

A further embodiment of the charged-particle optical system comprises a detector arranged to detect charged particles emanating from the object plane. In order to separately detect the different secondary charged-particle beams generated by the respective beamlets, the detector effectively comprises a plurality of detector elements configured such that each of the detector elements receives charged particles generated on the object by one beamlet.

Further embodiments of the present invention provide a method, comprising: directing a first number of charged particle beamlets onto an object while an electric field applied to a surface of the object has a first field strength; and directing a second number of charged particle beamlets onto the object while the electric field applied to the surface of the object has a second field strength. Hereby, the first number is preferably smaller than the second number with the first electric field strength being smaller than the second electric field strength. The method is effectively performed using a charged-particle multi-beamlet system according to one of the above-described embodiments of the invention.

BRIEF DESCRIPTION OF THE DRAWINGS

In the following description, the present invention is explained in more detail with respect to special embodiments and in relation to the accompanying drawings, in which.

DETAILED DESCRIPTION OF EXEMPLARY EMBODIMENTS

In the exemplary embodiments described below, components similar in function and structure are indicated as far as possible by similar reference numerals.

Figure 1:
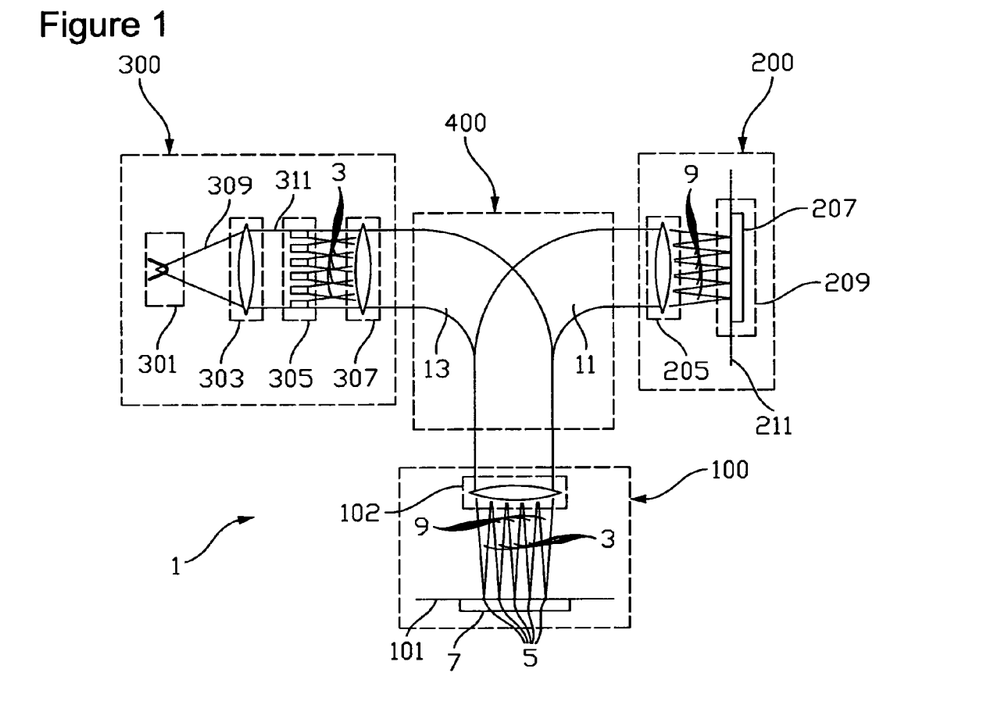
FIG. 1 is a schematic illustration showing basic features and functions of a multi-beamlet charged-particle microscopy system.

The schematic representation of FIG. 1 illustrates basic features and functions of a multi-beamlet charged-particle microscopy system 1. It is to be noted that the symbols used in the Figure do not represent physical configurations of the illustrated components but have been chosen to symbolize their respective functionality. The type of system shown is that of a scanning electron microscope (SEM) using a plurality of primary electron beamlets 3 for generating primary electron beam spots 5 on a surface of an object 7 located in an object plane 101 of an objective lens 102. It goes however without saying that the features and functions of system 1 can also be implemented using instead of electrons other types of primary charged particles such as ions and in particular helium ions, positrons, muons, and others.

The microscopy system 1 shown comprises a charged-particle multi-beamlet generator 300 for generating a plurality of primary charged-particle beamlets 3, a beam splitter unit 400 for separating the secondary charged-particle beam path 11 from the primary charged-particle beam path 13, an object irradiation unit 100 adapted to focus the primary charged-particle beamlets 3 onto the object plane 101, and a detection unit 200 for creating individual intensity signals for each of the secondary charged-particle beamlets 9.

In the embodiment illustrated, the primary beamlet generator 300 comprises an electron source 301, a collimating lens 303, a primary beamlet-forming unit 305, and a field lens 307.

The electron source 301 generates a diverging electron beam 309 that is collimated by the collimating lens to form a beam 311 incident on the primary beamlet-forming unit 305. Instead of an electron source generating just one diverging electron beam 309 as shown in FIG. 1, an electron source creating two or more diverging electron beams may be used. The two or more electron beams are then collimated either by just one collimating lens 303 or by an appropriate number of collimating lenses 303, each collimating a subset or just one of the individual electron beams 309.

The beamlet-forming unit 305 basically comprises a first multi-aperture plate illuminated by the one or more electron beams 311 and a second multi-aperture plate located, with respect to the direction of movement of the electrons in beam 311, downstream of the first multi-aperture plate. The second multi-aperture plate is preferably set to a defined potential so that a focussing quality is conferred to the apertures and the second multi-aperture plate takes on the function of a micro lens array. Further details of the beamlet-forming unit 305 are explained below with reference to different embodiments of the charged-particle multi-beamlet generator.

The primary electrons incident on object 7 at a beam spot 5 generate secondary electrons emanating from the surface of the object 7. The secondary electrons form secondary electron beamlets 9, which traverse the objective lens 102 and the beam splitter unit 400 following the secondary beam path 11. The beam splitter unit 400 separates the secondary beam path 11 from the primary beam path 13 usually by means of magnetic fields and directs the secondary beam path 11 to a detection unit 200.

The detection unit 200 comprises a projecting lens 205 for projecting the secondary electron beamlets 9 onto a surface plane 211 of an electron sensitive detector 207 of a detector arrangement 209. The electron sensitive detector 207 can be a single device or comprise more than one individual detectors. Irrespective of this, detector 207 provides an array of sensing areas arranged in a pattern compatible to the pattern of the secondary charged-particle beamlets 9 focussed by the projecting lens 205 onto the detector surface 211. This enables a detection of each individual secondary charged-particle beamlet 9 independent of the other secondary charged-particle beamlets 9 incident on the detector surface 211. Thus a plurality of electrical signals is created, whereby the value of each signal corresponds to the characteristics of just one of the secondary beamlets 9.

If the primary beamlet generator 300 allows not only to change the patterns of the primary beamlets 3 such that each pattern forms a sub-pattern of a basic pattern, but also to change the basic pattern, the detector arrangement 209 is preferably equipped with further detectors 207, each having its sensing areas arranged in a different basic pattern. Since the patterns of the secondary beamlets 9 correspond to the patterns of the primary beamlets 3 generated by the primary beamlet generator 300, the sensing area array pattern of each detector 207 preferably corresponds to one of the patterns available for the primary beamlets 3.

The object irradiation unit 100 comprises an objective lens 102 focussing the primary charged-particle beamlets 3 onto the object plane 101 in which the investigated surface of an object 7 is positioned by an object mount like for example a sample stage. The object mount is not shown in the Figures.

Figure 2:
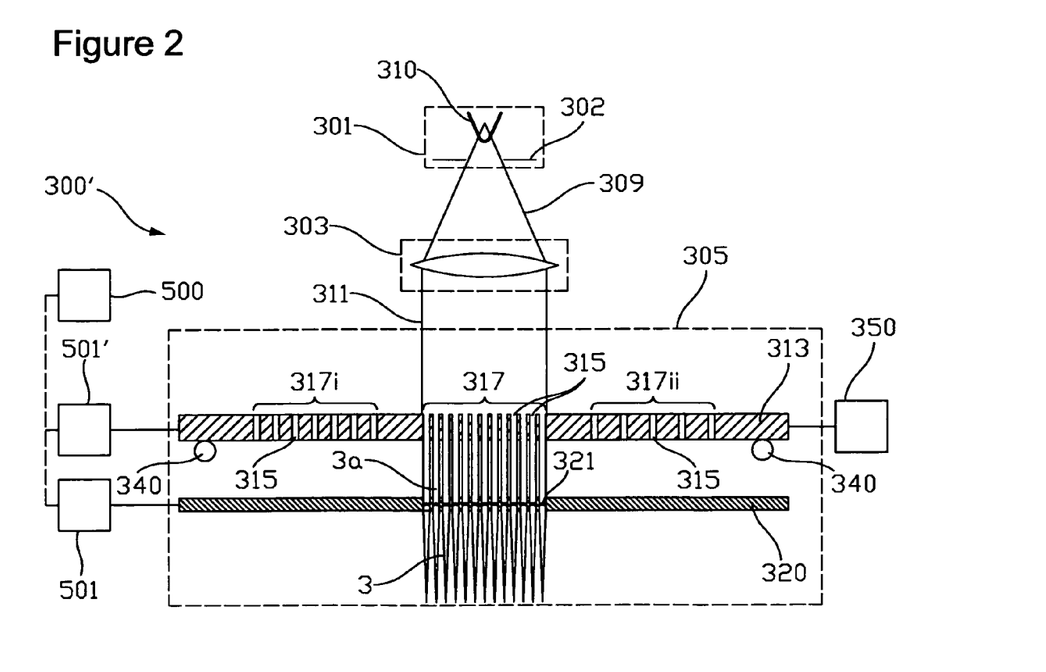
FIG. 2 is a schematic illustration of a first embodiment of a charged-particle multi-beamlet generator.

The schematic representation of FIG. 2 shows basic components of a first embodiment of a beamlet generating arrangement 300' for use in beamlet generator 300. The primary beamlets 3 are only shown up to their first focal plane, but it is understood that the beamlets continue beyond that plane to enter the field lens 307 (only shown in FIG. 1) and follow the primary charged-particle beam path 13.

The beamlet generating arrangement 300' comprises a source of charged primary particles 301, a collimating lens 303, and a primary beamlet-forming unit 305.

In the illustrated example, the primary charged particle source is implemented in form of an electron source 301 featuring an emitter tip 310 and an extraction electrode 302. When using primary charged particles other than electrons, like for example helium ions, the configuration of the primary charged-particle source 301 may be different to that shown.

The electron source 301 emits a divergent electron beam 309, which is collimated in the shown example by collimating lens 303 to form a collimated beam 311. The collimating lens 303 is usually formed by one or more electrostatic or magnetic, or by a combination of electrostatic and magnetic lenses. The use of a collimating lens is not imperative, but it is preferred when the multi-aperture plates used in the beamlet-forming unit 305 have a planar configuration, i.e. a configuration where the apertures 315 are arranged in a non-curved plane. When no collimating lens 303 is used, the apertures 315 of the multi-aperture plates 313 and 320 are preferably arranged in a curved plane which curvatures are adapted to the divergence of the primary beam 309 as e.g. described in document WO 2007/028596 A1, which is hereby incorporated by reference.

The collimated beam 311 (or the non-collimated beam, if no collimating lens is used) is incident on the multi-aperture selector plate 313 of the primary beamlet-forming unit 305. The multi-aperture plate selector 313 has two or more aperture arrays 317 formed therein. Each aperture array comprises one or more apertures 315 formed in the multi aperture selector plate 313. The apertures of a multi-aperture array may be arranged in a one-dimensional or in a two-dimensional pattern, whereby two-dimensional patterns are preferred for a fast inspection of an object's surface.

The sectional view of FIG. 2 shows aperture arrangements of three different multi-aperture arrays, namely array 317, which is in the illustration of FIG. 2 irradiated by the collimated electron beam 311, and arrays 317i and 317ii, which are both positioned outside of the electron beam 311. The different aperture arrays typically differ from each other in the number of apertures present in each array, the geometrical arrangement of the apertures, the size and/or shape of the apertures, or a combination thereof.

In the exemplary embodiment illustrated in FIG. 2, all multi-aperture arrays are formed within one multi-aperture selector plate 313. When selecting a distinct one of the multi-aperture arrays, a carrier 340 holding the multi-aperture selector plate 313 is moved using an actuator 350 such, that the desired multi-aperture array is positioned in the electron beam 311. In a further embodiment of the primary beamlet-forming unit 305, the carrier 340 is configured to carry more than one multi-aperture selector plates, whereby each of the multi-aperture selector plates has only one multi-aperture array formed therein. In still a further embodiment of the primary beamlet-forming unit 305, at least one of the multi-aperture selector plates has more than one multi-aperture array formed therein, whereby the basic pattern of the multi-aperture array or arrays in one of the multi-aperture selector plates may according to an advantageous development differ from the basic pattern of a multi-aperture array formed in another. The carrier 340 can further be adapted to carry one or multi-aperture selector plates 313 in an exchangeable manner. The carrier 340 can for instance have a carousel-like structure with one or more clamps for detachably holding a multi-aperture selector plate 313 with one or more multi-aperture arrays 317 formed therein. The different multi-aperture plates may be stored in a parking position from where they can be picked up and dropped with the clamping mechanism. Instead of a carousel-like structure also other structures as e.g. a linear displacement mechanism like a X-Y-table may be used.

The width of the collimated electron beam 311 (or of the non-collimated beam at the position of the multi-aperture selector plate 313) is preferably adapted to the size of the multi-aperture arrays 317, i.e. the cross-sectional geometry of the beam is configured to irradiate all apertures of a multi-aperture array 317, 317i and 317ii formed in the multi-aperture selector plate 313. In a modification of the embodiment illustrated in FIG. 2, a mask is positioned upstream of the multi-aperture selector plate 313 for adapting the cross-sectional geometry of the charged-particle beam 311 to the periphery of multi-aperture arrays 317, 317i and 317ii. The mask is preferably formed by a plate-like structure having an aperture configured to mask out the peripheral parts of the charged-particle beam 311. The aperture's geometry is hereby preferably adapted to confine the charged-particle beam 311 to the area defined by the maximum perimeter allowed for a multi-aperture array.

According to a further preferred embodiment, the mask comprises a multi-aperture array instead of a single aperture, whereby the pattern of the multi-aperture array represents the union of all multi-aperture arrays formed in the multi-aperture selector plate. The multi-aperture array mask 330 (only shown in FIG. 7) blocks out all parts of a charged-particle beam 311, which impinge on the solid regions of the mask. Only the charged particles entering the apertures can traverse the multi-aperture mask thereby forming as many partial beams 3a as there are apertures in the mask. The multi-aperture selector plate 313 positioned downstream of the multi-aperture mask is then used to select particular ones of the number of partial beams 3a formed by the multi-aperture mask. Placing a multi-aperture mask upstream of the multi-aperture selector plate 313 improves the stability of the optical parameters of the primary beamlet-forming unit 305, since the thermal stress of the multi-aperture selector plate 313 is reduced by the multi-aperture mask absorbing already most of the energy of the non-used parts of the charged-particle beam 311.

The partial beams 3a selected with the multi-aperture selector plate 313 enter the apertures of a second multi-aperture array 320, whereby each of the partial beams 3a traverses a different one of the apertures formed in the second multi-aperture array 320. It is noted that the second multi-aperture array 320 may comprise further apertures in addition to those being traversed by the partial beams 3a, i.e. to reduce possible aberration effects.

An electrically conductive plate having the apertures formed as openings 321 therein typically forms the second multi-aperture array 320. The plate is set to an appropriate electrical potential. For setting the potential, a voltage supply 501 controlled by a controller 500 is used. The same potential is usually also applied to the multi-aperture selector plate or plates 313. In some embodiments a separate voltage supply 501' controlled by a controller 500 is used to control the voltage difference between the multi-aperture selector plate or plates 313 and the second multi-aperture array 320. By applying an appropriate electrical potential to the multi-aperture array 320, the electric field in the vicinity of the array's openings is curved thereby focussing the partial beams 3a to form the beamlets 3.

In a further preferred embodiment (not shown in the Figures), the multi-aperture selector plate or plates 313 and the second multi-aperture array 320 are disposed in a space free of electrical fields with the focussing of the beamlets effected by an electrostatic lens located downstream of the second multi-aperture array 320.

Each of the apertures thus forms a micro lens and the second multi-aperture array 320 represents a micro lens array 320 as explained above. The peripheral geometry of each of the micro lenses 321, i.e. the contour of each opening 321, is at least identical with the contour of the cross-sectional geometry of the respective partial beam 3a traversing it, but preferably greater to reduce aberrations. In other words, the contour of an aperture 315 in a multi-aperture array 317 is smaller or equal than the contour of the corresponding micro lens traversed by the same partial beam, which is to say that the contour of an aperture 315 does not extend beyond the contour of the corresponding micro lens when seen in the direction of the partial beam 3a traversing both.

The shape and location of a micro lens 321 is preferably adapted to the shape and location of the corresponding aperture 315 in the micro-aperture plate 313. The micro-lens array 320 may further comprise additional structures improving the quality of the beamlets 3. Details hereto are e.g. described in document WO 2005/024881, which is hereby incorporated by reference.

Unlike the multi-aperture selector plate 313, the micro lens array 320 according to the embodiment illustrated in FIG. 2 contains only one array of micro lenses 321. The number and arrangement of the micro lenses 321 represent the union of the individual multi-aperture arrays 317, 317i, and 317ii provided by the multi-aperture selector plate 313. The micro lenses 321 are located at positions arranged in a predefined pattern. The location of a micro lens is hereby defined by a certain characteristic of its geometry, like for instance a centre of a circular or elliptical contour or the like.

The positions of the apertures 315 of the arrays 317, 317i, and 317ii are also arranged in a pattern. The aperture positions are defined in the same manner than those of the micro lenses. The multi-aperture array patterns 317, 317i, and 317ii correspond to the pattern of the micro lens array in that they are either identical to it or form a subset thereof. When using a divergent charged-particle beam 309 instead of a collimated charged-particle beam 311, the pattern of a multi-aperture array 317 is typically a scaled version of the micro lens array pattern or of a subset thereof.

Figure 3:
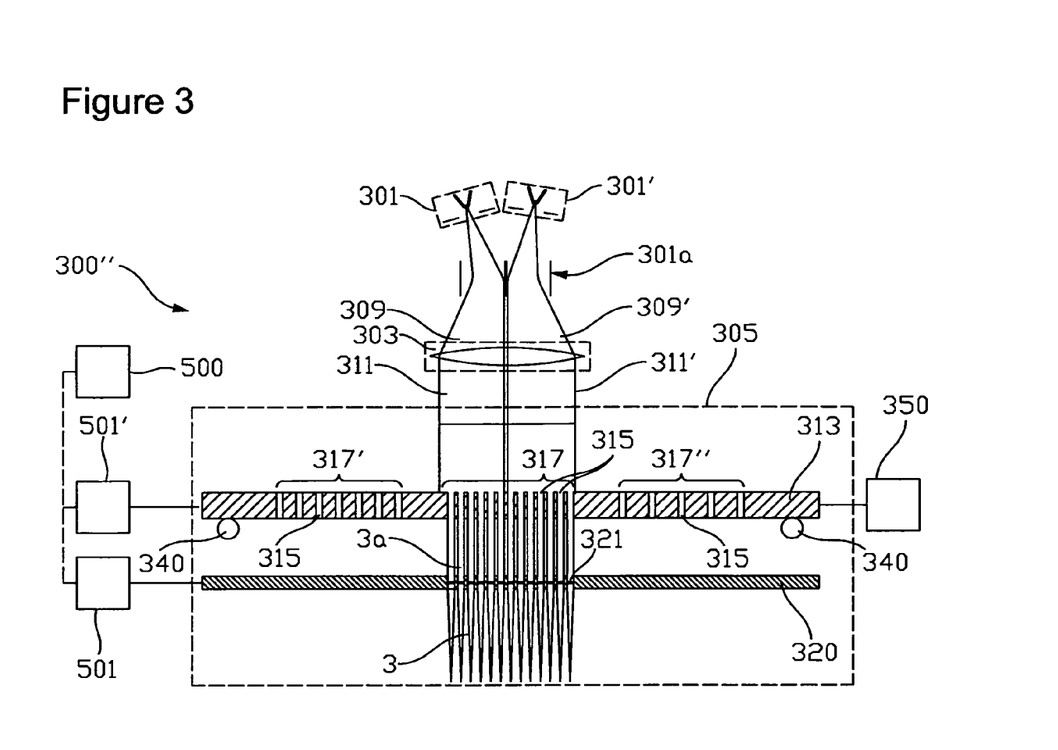
FIG. 3 is a schematic illustration of a second embodiment of a charged-particle multi-beamlet generator.
Figure 4:
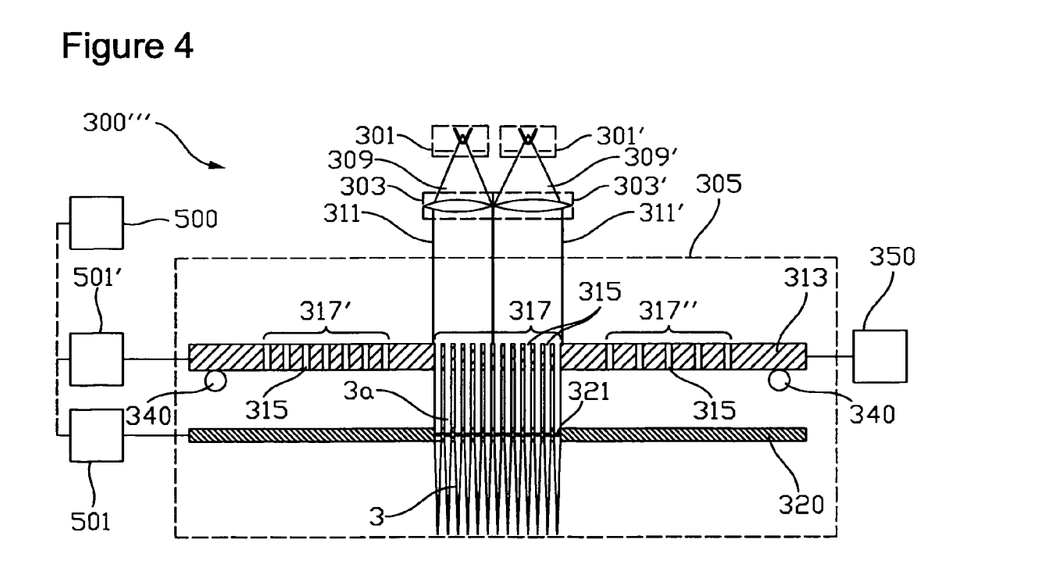
FIG. 4 is a schematic illustration of a third embodiment of a charged-particle multi-beamlet generator.

FIGS. 3 and 4 illustrate further embodiments 300" and 300'" of a charged-particle multi-beamlet generator 300. The embodiments each comprise a primary beamlet-forming unit 305 with the same configuration than a multi-beamlet generator 300 according to FIG. 2, but a different configuration for generating the collimated primary beam 311 incident on the beamlet-forming unit 305.

The embodiments shown have two primary charged-particle sources 301 and 301', but can also comprise more charged-particle sources, like for instance three or four. In the embodiment illustrated in FIG. 3, the primary beams 309 and 309' emitted from the charged-particle sources 301 and 301' are aligned by an electrostatic deflection unit 301a and then collimated by the same collimating lens 303. In the embodiment illustrated in FIG. 4, the primary beams 309 and 309' emitted from the charged-particle sources 301 and 301' are collimated separately using only one of the collimating lenses 303 and 303' in each individual primary beam path. The individual collimated charged particle beams 311 and 311' are arranged side-by-side to achieve a substantially contiguous illumination of the multi-aperture array 317. It is understood that for achieving a side-by-side arrangement of the collimated primary beams 311 and 311', further charged-particle-optic elements may be used in addition to those shown in the Figures, as for instance a deflection unit like unit 301a of FIG. 3 or different deflection units arranged along the collimated beam path.

Figure 5:
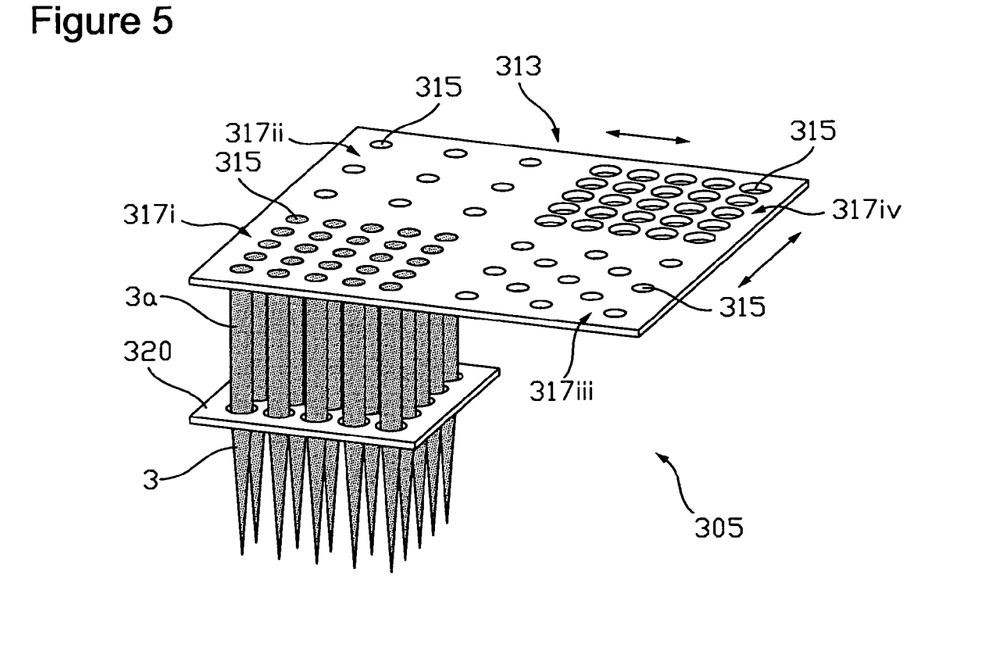
FIG. 5 is a schematic illustration of an embodiment of a primary beamlet-forming unit in an axonometric graphical projection.

The schematic of FIG. 5 illustrates the configuration and function of an exemplary embodiment of a primary beam-forming unit 305 having a multi-aperture selector plate 313 with four different multi-aperture arrays 317i, 317ii, 317iii, and 317iv formed therein. The apertures of each of the multi-aperture arrays are arranged at positions of a basic pattern represented by the position pattern of array 317i and 317iv, namely a rectangular 5-by-5 pattern. The multi-aperture selector plate 313 can be displaced in a plane parallel to its main faces for changing the multi-aperture array inserted into the charged-particle beam 311.

The apertures of the arrays shown in the illustrated example all have a circular contour, whereby the diameter of the apertures of the fourth array 317iv is bigger than the diameter of the apertures in the other three arrays. The apertures of the first array 317i and of the fourth array 317iv are arranged in a pattern corresponding to a regular rectangular grid configuration. The apertures of the second 317ii and third 317iii multi-aperture array each are arranged in pattern forming a sub-pattern of that of arrays 317i and 317iv. In the illustrated example, the multi-aperture arrays are formed in just one multi-aperture selector plate 313. In different embodiments hereof, two or more multi-aperture selector plates 313 may be used as described above, with each of the multi-aperture selector plates 313 providing one or more multi-aperture arrays.

By inserting one of the multi-aperture arrays 317 into the path of the primary beam 311 (not shown in this Figure), an array of primary partial beams 3a is formed proceeding to the downstream positioned multi lens array 320. A conductive plate having apertures 315 formed therein forms the multi lens array 320. When applying an appropriate potential to the plate, the apertures 315 act as micro lenses focussing the partial beams 3a to form the beamlets 3. It is not necessary to have the micro lens array made in total from electrically conductive material. As long as the surfaces of the lens array are electrically conductive, also other materials can be used. The partial beams 3a and the beamlets 3 are for better identification shown in FIG. 5 in a shaded representation. The rectangular perimeter of the multi lens array 320 is not imperative and can have in fact any shape desired or required e.g. for mounting it in an optical column of a charged-particle multi-beamlet system 1.

Figure 6:
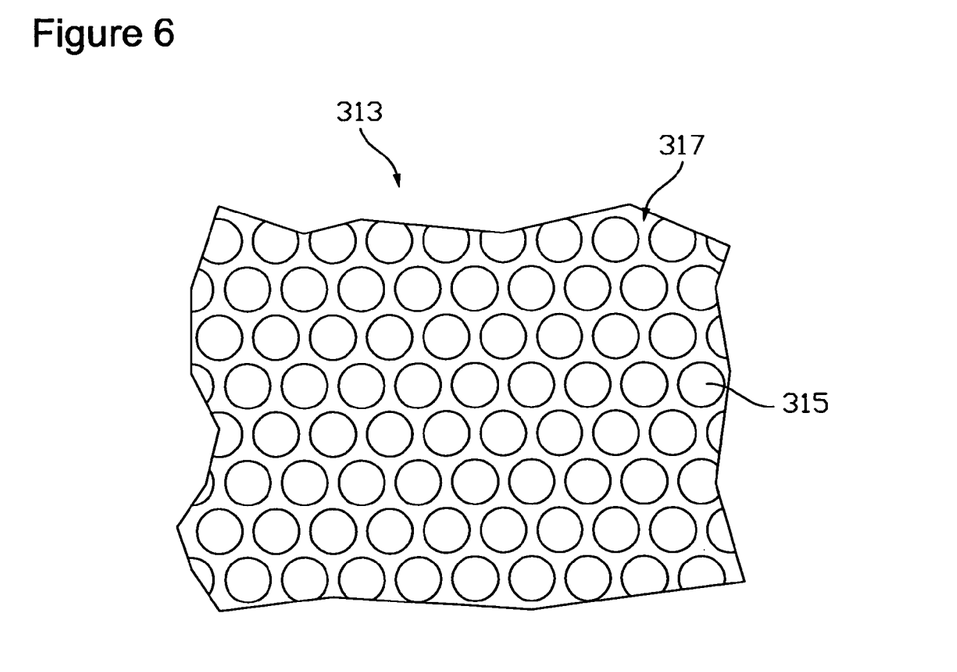
FIG. 6 shows a top view of a section of a multi-aperture array having the apertures arranged in a hexagonal configuration.

Instead of using just one multi lens array as indicated in FIG. 5, different micro lens arrays can be used allowing to change the basic pattern of a beamlet configuration e.g. from a rectangular grid like structure as shown in FIG. 5 to hexagonal structure like that of the section of a multi-aperture array 317 shown in FIG. 6. By changing the basic pattern of the beamlet configuration, it is for instance possible to change the beamlet density. When providing more than one micro lens array while using a multi-aperture mask 330 as described above, the multi-aperture mask is preferably configured with different mask aperture arrays, each of which conforms to one of the different multi lens arrays. The basic-pattern can be of any type and also the sub-patterns can be designed as desired, e.g. in star-like or other suitable pattern, as long as the sub-patterns conform to their corresponding basic patterns.

Figure 7:
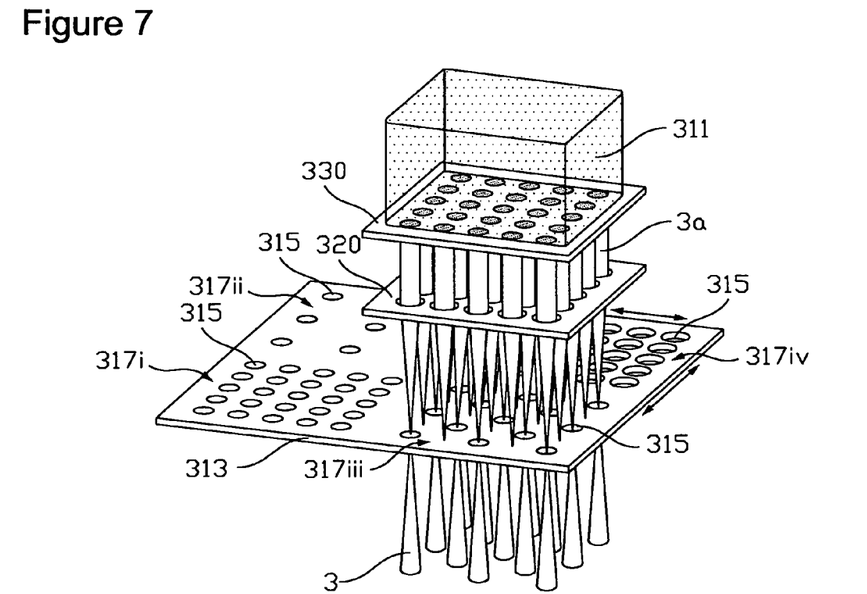
FIG. 7 shows a schematic illustration of an embodiment of a primary beamlet-forming unit in an axonometric graphical projection.

In a further embodiment, the multi lens array(s) 320 is (are) positioned upstream of the multi-aperture selector plate(s) 313, but downstream of the optional multi-aperture mask 330. A respective configuration is illustrated in FIG. 7, where the beamlet-forming unit 305 is shown to comprise three multi-aperture plates, the first multi-aperture plate 330 acting as a multi-aperture mask, the second multi-aperture plate 320 acting as a micro lens array, and the third multi-aperture plate 313 acting as a multi-aperture selector plate. The multi-aperture selector plate 313 is shown in FIG. 7 to be positioned in the focal plane of the micro lens array 320. It is however appreciated that the multi-aperture selector plate 313 may also be positioned beyond the micro lens array's focal plane, i.e. closer to or further downstream of the micro lens array 320. It is further noted that the collimated beam 311 as well as beamlets 3 are shown in a truncated representation and extent of course further than shown.

The described embodiments of a beamlet-forming unit 305 enable a generation of primary beamlet arrays with varying number of beamlets, varying patterns of the beamlet array and varying sizes of the individual beamlets. The described beamlet-forming units therefore enable a user of a respective charged-particle multi-beamlet system 1 to quickly adapt the density of the primary electron beam spots 5 on the surface and the amount of charge injected into the surface of an object 7 under investigation to the object's surface characteristics and also to the investigation requirements.

The number of primary beamlets 3 shown or indicated by the number of micro lenses or multi-aperture arrays in the Figures has only been chosen for illustrating purposes. In fact, the number of primary beamlets 3 generated with a beamlet-forming unit 305 may be any number between one and some thousands. In practice beamlet arrays of 30×30, 100×100 or others may be used. The pitch of the micro lenses may be in a range of 5 μm to 200 μm. The micro lens diameters may be in a range of 0.2 to 0.9 times the micro lens pitch, particularly in a range of 20% to 50% of the micro lens pitch, a range of 30% to 60% of the micro lens pitch, a range of 40% to 70% of the micro lens pitch, a range of 50% to 70% of the micro lens pitch, a range of 50% to 60% of the micro lens pitch, a range of 60% to 70% of the micro lens pitch, a range of 70% to 80% of the micro lens pitch, and/or a range of 80% to 90% of the micro lens pitch.

The number of beamlets that can be accommodated within an utilizable field of view determines mainly the throughput achieved with charged-particle multi-beamlet optical systems. The pitch between the beamlets 3 is defined by the minimum distance between the primary electron beam spots 5 on the object surface and determines the number of beamlets 3 that can be accommodated in a given field of view. The minimum possible pitch between the beamlets 3 is determined by the resolution with which the secondary electrons originating at the respective primary electron beam spots 5 can be projected onto the detector array 207. The resolution of the secondary electron beamlet 9 imaging depends mainly on the separation of the secondary electron beamlets 9, which is strongly affected by the opening angle of the secondary electron beamlets 9 at the object surface, and which in turn is a function of the strength of the electrical field in the vicinity of the object surface. Higher electrical field strengths improve the separation of the secondary electron beamlets 9 and result in a higher secondary path resolution.

When using a focussing lens with electrostatic components (like the one shown in FIG. 8), two contributions dominate the electrical field at the sample or object surface: the electrical field originating from the potential difference between the object surface and the surfaces of the focussing lens facing the object surface; and the electrical fields propagating from electrostatic components located in the optical column upstream of the object surface. The potentials of the optical column's components are usually defined by the columns optical properties and cannot be modified to adapt the electrical field at the sample surface. Thus, the field propagating from the optical column to the object surface represents rather a constraint than a parameter.

An optimum throughput requires a minimum beamlet pitch, which is only achieved with an electrical field high enough to pull the secondary electrons from the sample surface inside a sufficiently narrow opening angle. In order to guarantee that electrical fields near an object's surface will not affect the object's surface configuration, some applications require the electrical field strength at the object's surface to be lower than will be required for other applications.

Figure 8:
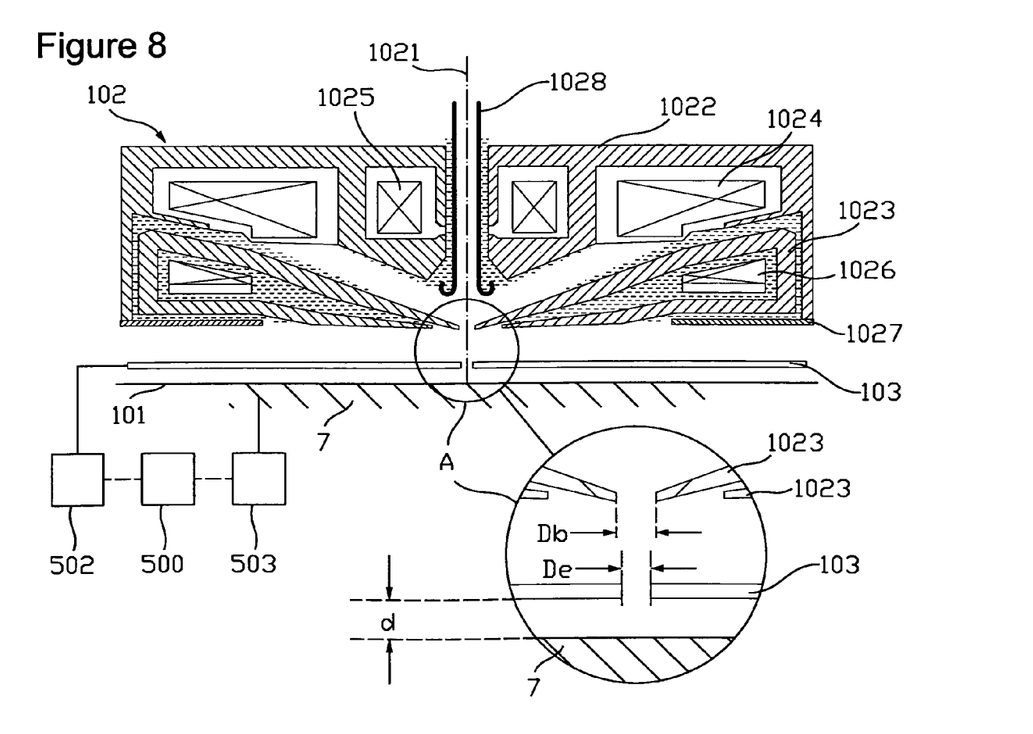
FIG. 8 shows a schematic illustration of an embodiment of a lower part of an optical column of a multi-beamlet charged-particle microscopy system according to FIG. 1.

For controlling the electrical field strength at the surface of an object positioned under the focussing lens 102, a field-separating electrode 103 is provided, which is in a preferred embodiment placed between the focusing lens and the object plane 101 of the focussing lens 102. The field-separating electrode subdivides the space between the focusing lens and the object surface in two regions and reduces the propagation of fields originating from components of the system's optical column to the sample surface.

The cross-sectional view of FIG. 8 shows an exemplary embodiment of the lower part of an optical column of a charged-particle multi-beamlet system 1. The illustrated part of the optical column comprises a focusing lens 102 and a field-separating electrode 103 positioned between the object lens 102 and the object plane 101, in which the surface of interest of an object 7 is located. The magnified view of detail A shows the lower parts of the objective lens 102, the field-separating electrode 103, and the sample 7 in a small region around the optical axis 1021, and defines parameters characteristic for the field-separating electrode 103. It is noted that the representation of FIG. 8 is not drawn to scale and that the dimensions used therein have been used for illustrative purposes only. In particular, the distance between the field-separating electrode 103 and the lower end of the focussing lens arrangement 102 is usually much smaller, and also the opening diameters of the focussing lens 102 and the field-separating electrode differ from each other to a greater extent.

The focusing lens 102 shown in FIG. 8 represents an objective lens arrangement positioned upstream of a sample or object 7, which is mounted on a stage (not shown in the Figure). The illustrated objective lens arrangement 102 comprises a first magnetic pole piece 1022, which is concentric about the optical axis 1021 (or axis of symmetry) of the optical column of the charged-particle multi-beamlet system 1. A second magnetic pole piece 1023 is disposed below (i.e. downstream) of the first pole piece 1022. Like the first, also the second magnetic pole piece 1023 has a rotationally symmetric configuration and is arranged concentric to the optical axis 1021. Cavities formed in both pole pieces accommodate excitation coils for generating magnetic fields substantially symmetric to the optical axis 1021.

The magnetic field generated by the first excitation coil 1024 has a focussing effect on the electrons of primary beamlets exiting the beam tube 1028 at its end facing the object plane 101. The second excitation coil 1025 generates a magnetic field, which serves to finely adjust a strength and position of the focusing magnetic field generated by the first excitation coil 1024. The magnetic field generated by the third excitation coil 1026 located within the second pole piece is adjusted to compensate the focussing magnetic field in the region defined by the gap between the first and the second pole piece. Details on the configuration and technical function of the objective lens arrangement 102 are described in the International Publication WO 2007/060017, which is hereby incorporated by reference.

A beam tube 1028 is arranged concentric around the optical axis 1021 penetrating the region surrounded by the first pole piece. A high voltage supply (not show in the Figure) is applied to the beam tube 1028 such that the primary charged particles are decelerated and the secondary charged particles originating from the surface of sample 7 are accelerated. Since the primary charged particles are decelerated in the beam tube 1028, they have to be extracted from the primary charged particle source 301 with a higher energy in order to guarantee that they reach the sample surface. The energy of the primary charged particles upon leaving source 301 is typically between 15 keV and 60 keV, and the retarding potential of beam tube 1028 between 15 kV and 30 kV, whereby the energy of the primary charged particles when exiting beam tube 1028 in the direction of the sample is typically set between 15 keV and 60 keV.

The magnetic pole pieces can be set to different electrical potentials. The first pole piece can for instance be set to ground potential, while the second pole piece is set to a potential different from ground potential for adjusting the electric field strength at object 7. The landing energy of the primary charged particles is hereby set to values of typically from about 50 eV to about 3 keV.

It is noted that different to the objective lens arrangement 102 shown in FIG. 8, also other types of object lenses may be used with the present invention like for instance a single-excitation coil objective lens arrangement.

The electric field generated with beam tube 1028 extends through the bore of the focusing lens 102 to the sample surface. It superimposes the electrical field generated by the potential difference between the lower pole piece 1023 and the sample surface. The resulting total field strength at the sample's surface of interest is a weighted sum of the field strength of the two fields.

In order to adjust the field strength at the sample surface to the requirements of a particular application, a field-separating electrode is placed between the focusing lens 102 and the sample at a distance d upstream of the sample surface as illustrated in FIG. 8. The field-separating electrode 103 has an opening, which is positioned concentric to the optical axis 1021 of the system's optical column and the bore of the objective lens arrangement 102. The diameter De of the field-separating electrode' aperture is smaller than the bore diameter Db of the objective lens arrangement 102. The ratio between the bore diameter Db and the diameter De of the aperture in the field-separating electrode 103 is preferably greater than 2, more preferably greater than 10, and most preferably greater than 20. The diameter of the aperture is preferably adapted to the field of view used, whereby diameters of less than 2.0 mm, preferably less than 1.5 mm, more preferably less than 1.0 mm, much more preferably less than 0.8 mm, even more preferably less than 0.6 mm, and most preferably less than 0.4 mm are preferred.

With the diameter of the field-separating electrode's aperture or opening being small enough, the electrical field at the sample surface is mainly defined by the potential difference between the sample and the field-separating electrode. The strength of the electrical field directly above the sample's surface of interest can thus be effectively controlled by the potential of the field-separating electrode. The voltage difference can be controlled using a controller 500, which may either be the controller also used for the beamlet generating arrangement or a separate one. The controller is adapted to control the voltage difference between the sample surface and the field-separating electrode 103. On the exemplary embodiment illustrated in FIG. 8, the controller 500 controls hereto the voltage supply 502 of the field-separating electrode 103 and the voltage supply 503 of the sample 7.

By applying different voltage differences between the field-separating electrode 103 and the sample surface, the charged-particle optical system 1 can be operated in two or more modes, each adapted to a particular application. Since the resolution of the secondary electron beamlet 9 imaging is lower for lower and higher for higher electrical extraction field strengths at the sample surface, an optimum throughput requires an adaptation of the primary beamlet pitch to the voltage difference used between the field-separating electrode 102 and the sample 7. Lower voltage differences require higher pitches than higher voltage differences. Therefore, when the system is operated in a first mode of operation with a first number of primary charged-particle beamlets 3, a first voltage difference is applied between the field-separating electrode 103 and the sample surface, and when the system is operated in a second mode of operation with a second number of primary charged-particle beamlets 3, a second voltage difference is applied between the field-separating electrode 103 and the sample surface. Assumed that there are fewer primary beamlets 3 in the first mode of operation than in the second mode of operation, the first voltage difference is smaller than the second voltage difference. Accordingly, also the electrical field strength achieved with the potential difference between the field-separating electrode 103 and the sample 7 is at the sample surface smaller for the first mode of operation than for the second mode of operation.

Figure 9:
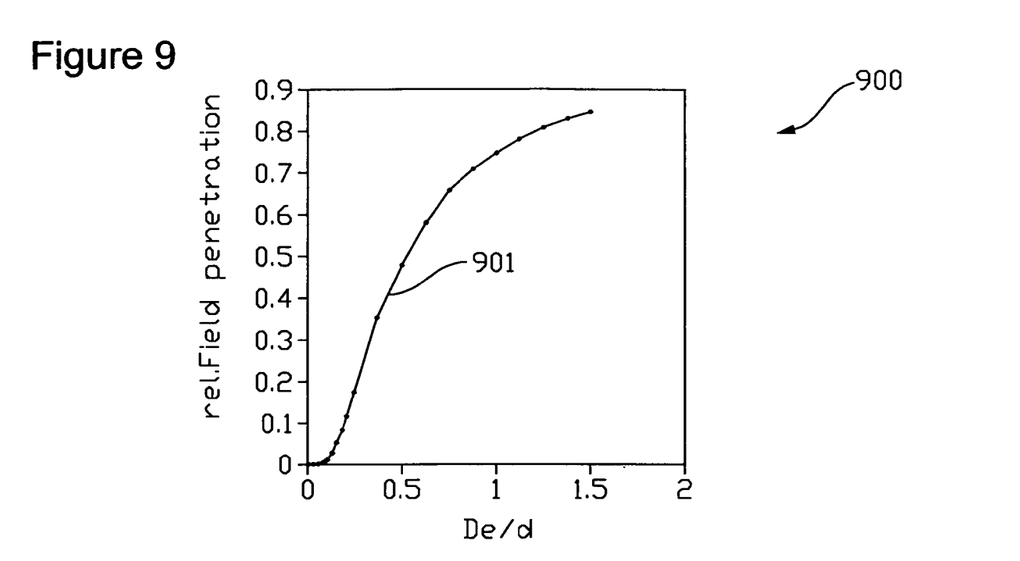
FIG. 9 shows a diagram illustrating the dependence of the field penetration from the aperture diameter of a field-separating electrode shown in FIG. 8 and its distance to an objects surface.

FIG. 9 shows a diagram 900 illustrating the relation 901 of the relative field penetration versus the ratio De/d between the diameter De of the field-separating electrode's aperture and the distance d between the sample surface and the lower face of the field-separating electrode 103. The diagram has been calculated for a distance d of 0.8 mm between the sample surface and the lower face of the field-separating electrode, while the diameter of the opening in the field-separating electrode 103 has been varied from 0.01 mm to 1.2 mm. The external field, calculated as a 30 kV potential difference over 5 mm corrected by a field penetration factor of the lower (second) pole piece of 0.66, resulted in a field strength at the upstream surface of the field-separating electrode of 4 kV/mm. Field penetration was defined as the ratio of the field at the sample surface to the field at the upstream surface of the field-separation electrode.

Up to a value of De/d of about 0.125 (corresponds in the present calculation to De=0.1 mm), the external field does practically not reach the sample surface. With diameter De further increased, the field penetration increases in a first approximation logarithmically being short of 50% at De/d=0.5 (De=0.4 in the present calculation) and about 85% at De/d=1.5. The diameter De of the field-separating electrode's aperture can thus be used as a second parameter (the first being the voltage difference between sample 7 and field-separating electrode 103) to control the strength of the electrical field directly above a sample's or object's surface of interest.

Figure 10:
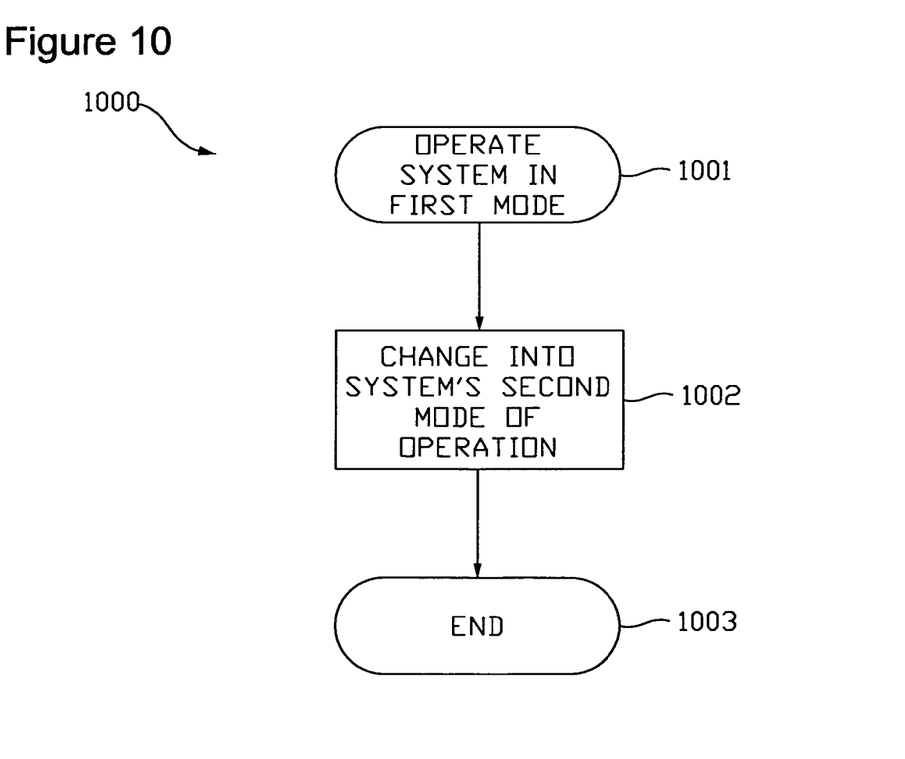
FIG. 10 shows a flowchart illustrating basic method steps used in embodiments of a method according to the present invention.

The flowchart 1000 shown in FIG. 10 illustrates basic steps of a method used in an embodiment according to the present invention. The method starts in step 1001 with selecting a first number of charged-particle beamlets 3 to be incident on an object 7 or sample 7, while an electric field having a first electric field strength is applied to the sample surface. The strength of the electric field is preferably adjusted by using a charged-particle multi-beamlet system 1 according to one of the embodiments described above, and a respective control of the voltage difference between the sample surface and the field-separating electrode.

In the next step 1002, the system is switched to a second mode of operation, where a second number of charged-particle beamlets 3 is selected to be incident on an object 7 or sample 7, while an electric field having a second electric field strength is applied to the sample surface. Again, the strength of the electric field is preferably adjusted by using a charged-particle multi-beamlet system 1 according to one of the embodiments described above, and a respective control of the voltage difference between the sample surface and the field-separating electrode. When the second number of selected beamlets 3 is higher than the first number, the second electrical field strength is also higher than the first electrical field strength and vice versa.

The method ends at step 1003. Alternatively, the irradiation of the sample can be repeated or it can be continued at a different position of the sample surface beginning with step 1001 and proceeding further to step 1002, or beginning with step 1002 and proceeding then to step 1001

While the present invention has been shown and described herein in what is believed to be the most practical and preferred embodiments, it is recognised that many alternatives, modifications, and variations will be apparent to those skilled in the art. Accordingly, the exemplary embodiments of the invention set forth herein are intended to be illustrative and not limiting in any way. Various changes may be made without departing from the spirit and scope of the present invention as defined in the following claims.

The invention claimed is:

1. A charged-particle multi-beamlet system comprising:
a source of charged particles;
a multi-aperture plate having plural apertures disposed in a charged particle beam path of the system downstream of the source;
a multi-aperture selector plate having plural apertures arranged in a first multi-aperture array;
a carrier, wherein the multi-aperture selector plate is mounted on the carrier;
an actuator configured to move the carrier such that the first multi-aperture array is disposed in the charged particle beam path of the system downstream of the source in a first mode of operation of the system, and such that the first multi-aperture array is disposed outside of the charged particle beam path in a second mode of operation of the system;
an objective lens disposed in a beam path downstream of both the multi-aperture plate and the multi-aperture selector plate;
a stage for mounting an object in an object plane disposed downstream of the focusing lens; and
a field-separating electrode having an aperture disposed in the charged particle beam path downstream of the objective lens and upstream of the object plane;
wherein the source, the multi-aperture plate and the carrier are arranged such that a first number of one or more charged particle beamlets is generated at a position downstream of both the multi-aperture plate and the multi-aperture selector plate in the first mode of operation, and that a second number of one or more charged particle beamlets is generated at the position in the second mode of operation, wherein the first number of beamlets differs from the second number of beamlets;
wherein the aperture of the field-separating electrode has a diameter such that it is traversed by the first number of beamlets in the first mode of operation and by the second number of beamlets in the second mode of operation; and
wherein the objective lens is configured to focus each charged particle beamlet traversing the aperture of the field separating electrode in the object plane.

2. The charged-particle multi-beamlet system according to claim 1, wherein the objective lens has bore diameter, and wherein at least one of the following relations is fulfilled:
Db/De>2, Db/De>5, Db/De>10 and Db/De>20, wherein Db is the bore diameter of the objective lens, and
De is a diameter of the aperture of the field-separating electrode.

3. The charged-particle multi-beamlet system according to claim 1, wherein a distance of the field-separating electrode from the object plane is smaller than at least one of: 2.0 mm, 1.2 mm, 0.8 mm, 0.5 mm, 0.3 mm and 0.2 mm, and/or wherein the diameter of the aperture of the field-separating electrode is smaller than at least one of: 2.0 mm, 1.5 mm, 1.0 mm, 0.8 mm, 0.6 mm and 0.4 mm.

4. The charged-particle multi-beamlet system according to claim 1, wherein the apertures of the first multi-aperture array are arranged in a regular pattern.

5. The charged-particle multi-beamlet system according to claim 1, wherein the apertures of the first multi-aperture array are arranged in a regular pattern including at least one of a hexagonal pattern and a rectangular pattern.

6. The charged-particle multi-beamlet system according to claim 1, further comprising a detector arranged to detect charged particles emanating from the object plane.

7. The charged-particle multi-beamlet system according to claim 1, further comprising a detector arranged to detect charged particles emanating from the object plane, the detector comprising a plurality of detector elements with the system being configured such that each of the detector elements receives charged particles generated on the object by one beamlet.

8. A charged-particle multi-beamlet system comprising:
a source of charged particles;
a multi-aperture plate having plural apertures disposed in a charged particle beam path of the system downstream of the source;
a multi-aperture selector plate having plural apertures;
a carrier, wherein the—multi-aperture selector plate is mounted on the carrier;
an actuator configured to move the carrier such that the first multi-aperture array is disposed in the charged particle beam path of the system downstream of the source in a first mode of operation of the system, and such that the first multi-aperture array is disposed outside of the charged particle beam path in a second mode of operation of the system;
an objective lens disposed in a beam path downstream of both the multi-aperture plate and the multi-aperture selector plate;
a stage for mounting an object in an object plane disposed downstream of the focusing lens;
a field-separating electrode having an aperture disposed in the charged particle beam path downstream of the objective lens and upstream of the object plane;
a first voltage supply configured to supply a first voltage to the multi-aperture plate such that charged particle beamlets traversing the apertures of the multi-aperture plate each have a beamlet focus at a distance downstream of the multi-aperture plate;
a second voltage supply configured to supply a second voltage to the field-separating electrode;
a third voltage supply configured to supply a third voltage to the object; and
a controller configured to control the actuator and the second and third voltage supplies;
wherein the source, the first multi-aperture plate and the carrier are arranged such that a first number of one or more charged particle beamlets is generated at a position downstream of both the multi-aperture plate and the multi-aperture selector plate in the first mode of operation, and that a second number of one or more charged particle beamlets is generated at the position in the second mode of operation, and wherein the first number of beamlets in the first mode of operation is smaller than the second number of beamlets in the second mode of operation;
wherein the aperture of the field-separating electrode has a diameter such that it is traversed by the first number of beamlets in the first mode of operation and by the second number of beamlets in the second mode of operation; and
wherein the objective lens is configured such that the focus of each beamlet is imaged onto the object plane.

9. The charged-particle multi-beamlet system according to claim 8, wherein the controller is configured to control the second and third voltage supplies such that a first voltage difference exists between the second voltage and the third voltage in the first mode of operation, and such that a second voltage difference exists between the second voltage and the third voltage in the second mode of operation, and wherein the first voltage difference is different from the second voltage difference.

10. The charged-particle multi-beamlet system according to claim 8, wherein the controller is configured to control the second and third voltage supplies such that a first voltage difference exists between the second voltage and the third voltage in the first mode of operation, and such that a second voltage difference exists between the second voltage and the third voltage in the second mode of operation, and wherein the first voltage difference is smaller than the second voltage difference.

11. The charged-particle multi-beamlet system according to claims 8, wherein the controller is configured to control the second and third voltage supplies such that a first electrical field strength exists at the object plane in the first mode of operation, and such that a second electrical field strength exists at the object plane in the second mode of operation, and wherein the first electrical field strength is different from the second electrical field strength.

12. The charged-particle multi-beamlet system according to claims 8, wherein the controller is configured to control the second and third voltage supplies such that a first electrical field strength exists at the object plane in the first mode of operation, and such that a second electrical field strength exists at the object plane in the second mode of operation, and wherein the first electrical field strength is smaller than the second electrical field strength.

13. The charged-particle multi-beamlet system according to claim 8, wherein the objective lens comprises magnetic pole pieces and at least one coil for generating a focusing magnetic field between the pole pieces.

14. The charged-particle multi-beamlet system according to claim 8, wherein the objective lens comprises magnetic pole pieces and at least one coil for generating a focusing magnetic field between the pole pieces, and wherein the controller is configured to control the focusing magnetic field such that the focusing magnetic field is a same field in both the first and second modes of operation.

15. The charged-particle multi-beamlet system according to claim 8, wherein the objective lens comprises at least one pair of electrodes and a voltage supply to generate a focusing electric field between the pair of electrodes.

16. The charged-particle multi-beamlet system according to claim 8, wherein the objective lens comprises at least one pair of electrodes and a voltage supply to generate a focusing electric field between the pair of electrodes, and wherein the controller is configured to control the focusing electric field such that the focusing electric field is a same field in both the first and second modes of operation.

17. A method, comprising:
directing a first number of charged particle beamlets onto an object while an electric field applied to a surface of the object has a first field strength; and
directing a second number of charged particle beamlets onto the object while the electric field applied to the surface of the object has a second field strength;
wherein the first number is smaller than the second number and wherein the first electric field strength is smaller than the second electric field strength; and
wherein the method is performed using the charged-particle multi-beamlet system according to claim 1.

18. A method, comprising:
directing a first number of charged particle beamlets onto an object while an electric field applied to a surface of the object has a first field strength; and directing a second number of charged particle beamlets onto the object while the electric field applied to the surface of the object has a second field strength;
wherein the first number is smaller than the second number and wherein the first electric field strength is smaller than the second electric field strength; and wherein the method is performed using the charged-particle multi-beamlet system according to claim 8.

* * * * *